(12) United States Patent
Lin et al.

(10) Patent No.: US 10,319,760 B2
(45) Date of Patent: Jun. 11, 2019

(54) IMAGE SENSOR

(71) Applicant: VisEra TECHNOLOGIES COMPANY LIMITED, Hsin-Chu (TW)

(72) Inventors: Kuo-Feng Lin, Kaohsiung (TW); Wu-Cheng Kuo, Hsin-Chu (TW); Chung-Hao Lin, Keelung (TW); Yu-Kun Hsiao, Hsin-Chu (TW)

(73) Assignee: Visera Technologies Company Limited, Hsin-Chu (TW)

( * ) Notice: Subject to any disclaimer, the term of this patent is extended or adjusted under 35 U.S.C. 154(b) by 206 days.

(21) Appl. No.: 14/803,995

(22) Filed: Jul. 20, 2015

(65) Prior Publication Data
US 2017/0025458 A1 Jan. 26, 2017

(51) Int. Cl.
*G01J 3/50* (2006.01)
*H01L 27/146* (2006.01)

(52) U.S. Cl.
CPC .. *H01L 27/14621* (2013.01); *H01L 27/14625* (2013.01); *H01L 27/14645* (2013.01); *H01L 27/14627* (2013.01)

(58) Field of Classification Search
CPC ......... H01L 27/14621; H01L 27/14627; H01L 27/14645
USPC .............................................. 250/208.1, 226
See application file for complete search history.

(56) References Cited

U.S. PATENT DOCUMENTS

| | | | | |
|---|---|---|---|---|
| 8,294,076 | B2* | 10/2012 | Nishiwaki | G02B 5/1871 250/208.1 |
| 8,922,690 | B2* | 12/2014 | Nakata | G02B 5/201 250/208.1 |
| 2003/0063204 | A1* | 4/2003 | Suda | H01L 27/14603 348/272 |
| 2011/0032398 | A1* | 2/2011 | Lenchenkov | H01L 27/14621 348/294 |
| 2012/0268631 | A1* | 10/2012 | Takase | G02B 3/0068 348/273 |
| 2013/0134536 | A1* | 5/2013 | Mori | H01L 27/1462 257/432 |
| 2014/0264685 | A1* | 9/2014 | Cheng | H01L 31/02327 257/432 |
| 2014/0339615 | A1* | 11/2014 | Wang | H01L 27/14621 257/294 |

(Continued)

FOREIGN PATENT DOCUMENTS

| | | |
|---|---|---|
| CN | 104167420 A | 11/2014 |
| JP | 2004-128201 A | 4/2004 |
| JP | 2006-121065 A | 5/2006 |

(Continued)

*Primary Examiner* — Georgia Y Epps
*Assistant Examiner* — Kevin Wyatt
(74) *Attorney, Agent, or Firm* — Muncy, Geissler, Olds & Lowe, P.C.

(57) ABSTRACT

An image sensor includes a sensing layer, a number of filter units, and a grid structure. The filter units are disposed on the sensing layer. The grid structure is disposed on the sensing layer and surrounding each of the filter units. The grid structure includes a first partition wall disposed on the sensing layer and located between two adjacent filter units, and a second partition wall disposed on the first partition wall located between the two adjacent filter units. The refractive index of the first partition wall is less than the refractive index of the second partition wall.

20 Claims, 9 Drawing Sheets

(56) References Cited

U.S. PATENT DOCUMENTS

2015/0048467 A1\*  2/2015  Weng .................. H01L 31/0232
                                                          257/432

FOREIGN PATENT DOCUMENTS

| JP | 2011-040454 A | 2/2011 |
| JP | 2014-225667 A | 12/2014 |
| JP | 2015-92521 A | 5/2015 |

\* cited by examiner

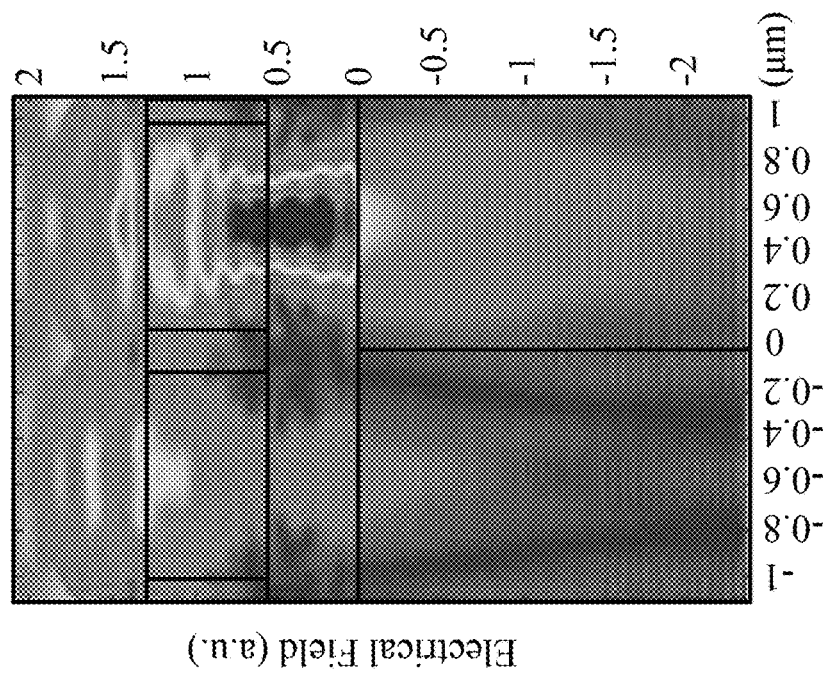
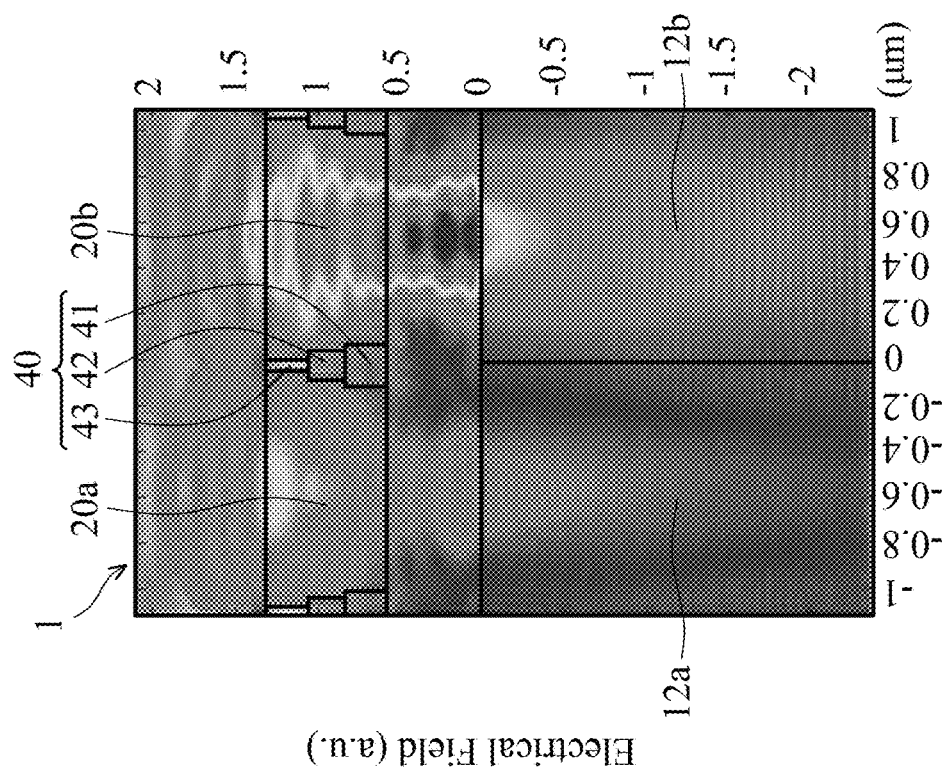
FIG. 3A
FIG. 3B

IMAGE SENSOR

BACKGROUND OF THE INVENTION

Field of the Invention

The present disclosure relates to an image sensor, and in particular to an image sensor having a filter unit and a grid structure surrounding the filter unit.

Description of the Related Art

In general, a digital camera utilizes an image sensor to sense light and generate an image signal, and thus a picture taken by the digital camera can be generated according to the image signal.

As digital cameras continue to develop, high-quality image signals are increasingly required. The image sensors using a backside illumination (BSI) technology have light pipe structures to guide light to photodiodes. The image sensors have greater photosensitivity and image quality.

Although image sensors have been generally adequate for their intended purposes, they have not been entirely satisfactory in all respects. Consequently, it is desirable to provide a solution for improving image sensors.

BRIEF SUMMARY OF THE INVENTION

The present disclosure provides image sensors for improving the quality of image signals generated by the image sensors.

The present disclosure provides an image sensor including a sensing layer, a number of filter units, and a grid structure. The filter units are disposed on the sensing layer. The grid structure is disposed on the sensing layer and surrounding each of the filter units. The grid structure includes a first partition wall disposed on the sensing layer and located between two adjacent filter units, and a second partition wall disposed on the first partition wall located between the two adjacent filter units. The refractive index of the first partition wall is less than the refractive index of the second partition wall.

The present disclosure provides an image sensor including a sensing layer, a number of filter units, and a grid structure. The filter units are disposed on the sensing layer. The grid structure is disposed on the sensing layer and surrounding each of the filter units. The grid structure includes a first partition wall disposed on the sensing layer and located between two adjacent filter units, and a second partition wall disposed on the first partition wall located between the two adjacent filter units.

In addition, the cross section of the first partition wall and the cross section of the second partition wall are rectangular or trapezoidal, and the cross sections are perpendicular to the sensing layer and in a transversal direction parallel to the sensing layer. The width of the first partition wall is greater than the width of the second partition wall, and the widths are measured in a transversal direction parallel to the sensing layer.

In conclusion, with the grid structure of the image sensor, the optical cross talk of the image sensor is minimized. Moreover, a portion of the light entering the grid structure is guided to the filter units, and thus the signal strength of the sensing units is improved. Therefore, the image quality of the image sensor is improved.

BRIEF DESCRIPTION OF THE DRAWINGS

The invention can be more fully understood by reading the subsequent detailed description and examples with references made to the accompanying drawings, wherein:

FIG. 3A is an electrical field distribution diagram at 520 nm of a cross section of the image sensor of the present disclosure using FDTD (Finite-difference time-domain) simulation method.

FIG. 3B is an electrical field distribution diagram at 520 nm of a cross section of a conventional image sensor using the same FDTD simulation method

DETAILED DESCRIPTION OF THE INVENTION

Figure 1:
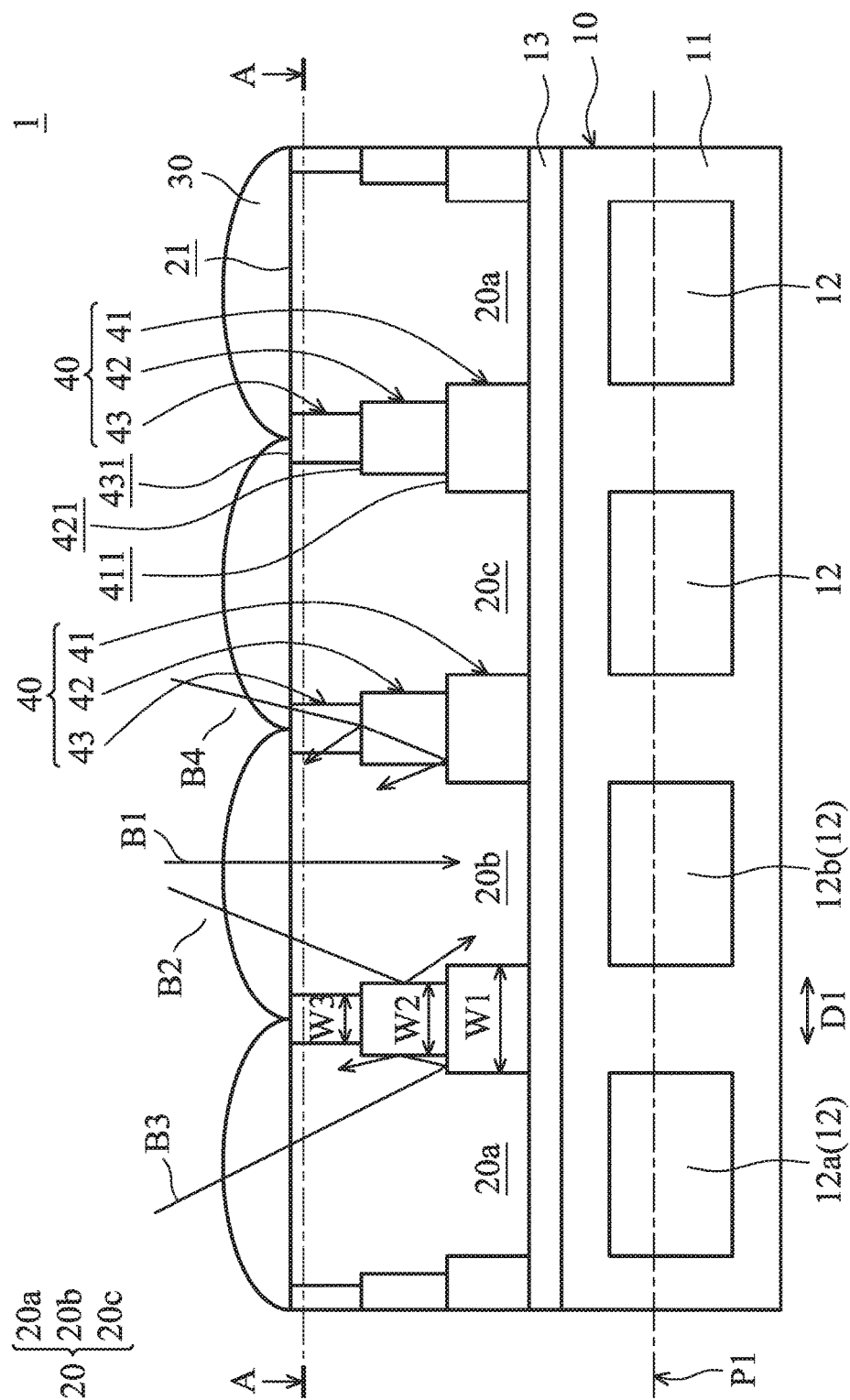
FIG. 1 is a schematic view of an image sensor in accordance with a first embodiment of the present disclosure.

The following disclosure provides many different embodiments, or examples, for implementing different features of the present disclosure. Specific examples of components and arrangements are described below to simplify the present disclosure. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Furthermore, the shape, size, and thickness in the drawings may not be drawn to scale, or the drawings may be otherwise simplified for clarity of discussion, as they are intended merely for illustration.

Figure 2:
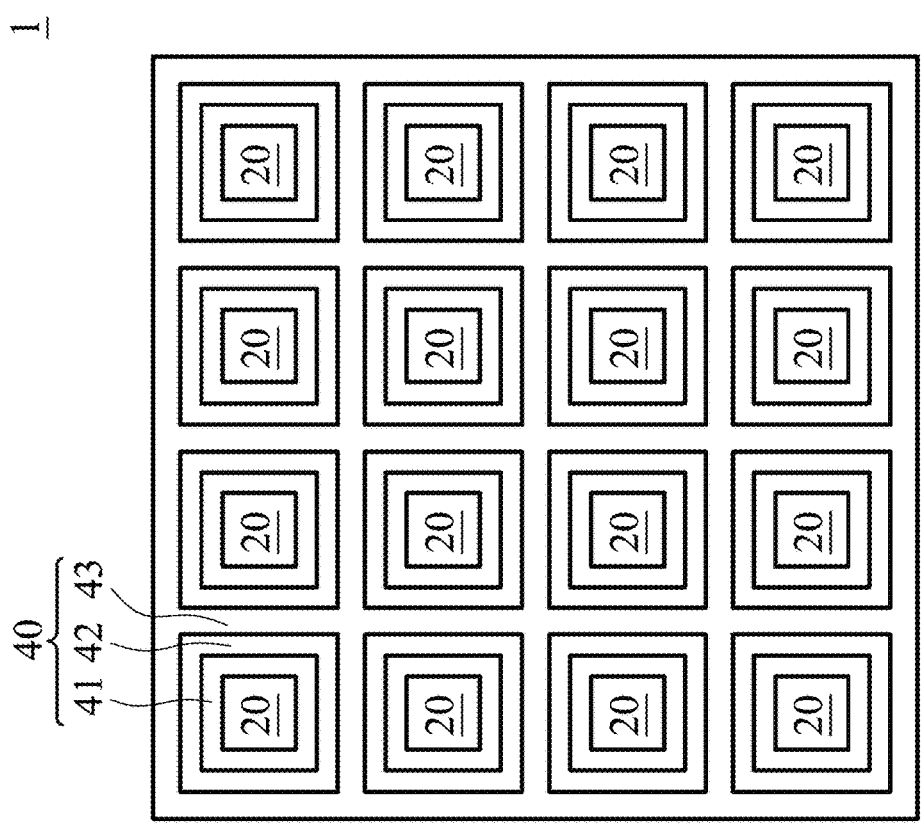
FIG. 2 is a cross-sectional view along the line AA of FIG. 1.

FIG. 1 is a schematic view of an image sensor 1 in accordance with a first embodiment of the present disclosure. FIG. 2 is a cross-sectional view along the line AA of FIG. 1. The image sensor 1 is configured to capture an image. The image sensor 1 can be applied to an imaging apparatus, such as a digital camera. In some embodiments, the image sensor 1 is a CMOS (Complementary Metal-Oxide-Semiconductor) sensor. In some embodiments, the image sensor 1 is a BSI (backside illumination) CMOS sensor.

The image sensor 1 includes a sensing layer 10, filter units 20, microlenses 30, and a grid structure 40. The sensing layer 10 extends along a reference plane P1. The sensing layer 10 is configured to detect incident light and generate an image signal according to the light falling on the sensing layer 10.

The sensing layer 10 may include all of the following elements, but the sensing layer 10 does not necessarily include all of the following elements, as long as the object of the sensing layer 10 is achieved. The sensing layer 10 includes a substrate 11, sensing units 12, and an anti-reflection layer 13. In some embodiments, the sensing layer 10 further includes other optional layers (not shown in figures).

The sensing units 12 are disposed in the substrate 11. The sensing units 12 are arranged in a sensing array at the reference plane P1. In some embodiments, the sensing units 12 are photodiodes. Each of the sensing units 12 is configured to sense light and generate an intensity signal according to the intensity of the light falling thereon. The image signal is formed by the intensity signals.

The anti-reflection layer 13 is disposed on the substrate 11. The anti-reflection layer 13 is configured to decrease the reflection of the light being transmitted to the sensing units 12. In some embodiments, the anti-reflection layer 13 is parallel to the sensing layer 10.

The filter units 20 are disposed on the anti-reflection layer 13 of the sensing layer 10. The filter units 20 are arranged in a filter array on a plane parallel to the reference plane P1. Each of the filter units 20 is disposed over one of the sensing units 12.

Each of the filter units 20 allows a predetermined range of wavelengths of light to pass through. In some embodiments, the filter units 20 are color filter units. The filter units 20 include red filter units 20a, green filter units 20b, and blue filter units 20c. The red filter units 20a, the green filter units 20b, and the blue filter units 20c are alternately arranged in the filter array.

The red filter unit 20a allows wavelengths of light in a range from 620 nm to 750 nm (red light) to pass to the sensing unit 12. The green filter unit 20b allows wavelengths of light in a range from 495 nm to 570 nm (green light) to pass to the sensing unit 12. The blue filter unit 20c allows wavelengths of light in a range from 476 nm to 495 nm (blue light) to pass to the sensing unit 12.

Each of the microlenses 30 is disposed on one of the filter units 20. The microlenses 30 are arranged in a microlens array on a plane parallel to the reference plane P1. The microlenses 30 are configured to focus light to the sensing units 12.

The grid structure 40 is connected to and around each of the filter units 20. Moreover, the grid structure 40 is disposed on the sensing layer 10, and is parallel to the reference plane P1. The grid structure 40 is configured to reflect the light in the filter units 20 toward the sensing units 12.

In some embodiments, the refractive index of the grid structure 40 is lower than the refractive index of the filter units 20, and thus the filter units 20 and the grid structure 40 form a light pipe structure to guide light to the sensing units 12. In some embodiments, the refractive index of the grid structure 40 is in a range from about 1.2 to about 1.5. The refractive index of the filter unit 20 is in a range from about 1.7 to about 3.2.

The grid structure 40 includes at least two layers of partition walls stacked on each other. In this embodiment, the grid structure 40 includes three layers of partition walls 41, 42 and 43. The partition walls 41, 42 and 43 are located between two adjacent filter units 20. The partition walls 41 are disposed on the sensing layer 10, the partition walls 42 are disposed on the partition walls 41, and the partition walls 43 are disposed on the partition walls 42.

The partition wall 41 has a top surface 411 opposite from the sensing layer 10. The top surface 411 is covered by the partition wall 42 and the two adjacent filter units 20. In some embodiments, the top surface 411 is in contact with the partition wall 42 and the two adjacent filter units 20.

The partition wall 42 has a top surface 421 opposite from the partition wall 41. The top surface 421 is covered by the partition wall 43 and two adjacent filter units 20. In some embodiments, the top surface 421 is in contact with the partition wall 43 and two adjacent filter units 20.

The partition wall 43 has a top surface 431 opposite from the partition wall 42. In this embodiment, the top surfaces 431 of the partition walls 43 (or the grid structure 40) and the top surfaces 21 of the filter units 20 at the same plane parallel to the reference plane P1. The top surface 431 of the partition walls 43 (or the grid structure 40) is covered by the microlens 30. The edge of the microlens 30 is in contact with the top surface 431 of the partition walls 43 (or the grid structure 40).

The cross sections of the partition wall 41, 42 and 43 are rectangular or trapezoidal. In this embodiment, the cross sections of the partition walls 41, 42 and 43 are rectangular. The cross sections of the partition walls 41, 42 and 43 are perpendicular to the sensing layer 10 and in a transversal direction D1 parallel to the sensing layer 10.

Moreover, the area of the cross section of the partition wall 41 is greater than the area of the cross section of the partition wall 42. The area of the second cross section of the partition wall 42 is greater than the area of the cross section of the partition wall 43.

In this embodiment, the width W1 of the partition wall 41 is greater than the width W2 of the partition wall 42. The width W2 of the partition wall 42 is greater than the width W3 of the partition wall 43. The widths W1, W2, and W3 are measured in the transversal direction D1 parallel to the sensing layer 10.

In some embodiments, the width W1 is in a range from about 150 nm to about 200 nm. The width W2 is in a range from about 100 nm to about 150 nm. The width W3 is in a range from about 50 nm to about 100 nm. In some embodiments, the width W1 is about 1.1 to 2 times the width W2. In some embodiments, the width W2 is about 1.1 to 2 times the width W3.

In some embodiments, refractive indexes of the partition walls 41, 42 and 43 are the same. In some embodiments, refractive indexes of the partition walls 41, 42 and 43 are in a range from about 1.2 to about 1.5.

The refractive index of the partition wall 41 is less than the refractive index of the partition wall 42. The refractive index of the partition wall 42 is less than the refractive index of the partition wall 43. In other words, the refractive indexes of the partition walls 41, 42 and 43 (or grid structure 40) are gradually decreased from the microlenses 30 to the sensing layer 10.

In some embodiments, the refractive index of the partition wall 41 is in a range from about 1.2 to about 1.35. The refractive index of the partition wall 42 is in a range from about 1.25 to about 1.45. The refractive index of the partition wall 3 is in a range from about 1.35 to about 1.5. In addition, the refractive index of the partition wall 43 is less than the refractive index of the filter units 20.

In some embodiments, the filter units 20 and the grid structure 40 comply with the following formula: $Ncf \times Dcf = \Sigma Neffm \times Dm$. The Ncf is an effect refractive index of the filter units 20, the Dcf is a thickness of the filter units 20, the Neffm is an effect refractive index of one of the partition walls 41, 42 and 43, and Dm is a thickness of one of the partition walls 41, 42 and 43. When the filter units 20 and the grid structure 40 comply with the described formula, the waveguide effect in the filter units 20 and the quantity of light passing through the filter units 20 are improved.

As shown in FIG. 1, when a light beam B1 falls on the image sensor 1, the light beam B1 passes through the microlenses 30 and the filter units 20 to the sensing units 12. The light beam B1 is focused by the microlenses 30. Each of the filter units 20 allows a predetermined range of wavelengths of light beam B1 to pass. Each of the sensing units 12 generates an intensity signal according to the intensity of the light beam B1 falling thereon, and the image signal is formed by the intensity signals.

In some embodiments, the light beam B2 passing through the filter units 20b may be transmitted toward the adjacent sensing unit 20a under the filter units 20a, for example. However, with the structure and/or the refractive index of the grid structure 40, the light beam B2 is reflected by the partition wall 42 of the grid structure 40.

Moreover, the light beam B3 passing through the filter units 20a may be transmitted toward the adjacent sensing unit 20b under the filter units 20b. With the structure and/or the refractive index of the grid structure 40, the light beam B3 is reflected by the top surface 411 of the partition wall 41. Therefore, the optical cross talk of the image sensor 1 is minimized, and thus the image quality of the image sensor 1 is improved.

In addition, a light beam B4 may enter into the grid structure 40. With the structure and/or the refractive index of the partition walls 41, 42 and 43, a portion of the light beam B4 may reflected by the top surface 421 of the partition wall 42, and guided into the filter unit 20b. A portion of the light beam B4 may be reflected by the top surface 411 of the partition wall 41, and guided into the filter unit 20b.

Therefore, the quantity of light passing through the filter units 20 to the sensing units 12 is increased, and the signal strength of the sensing units 12 is improved. Moreover, the light-leakage due to the grid structure 40 is minimized, and the waveguide effect in the filter units 20 and the quantity of light passing through the filter units 20 are improved. Accordingly, the image quality of the image sensor 1 is improved.

As shown in FIGS. 3A and 3B, the electric field intensity is more observably in a region of the green filter unit 20b and the sensing unit 12b which compared a corresponding region of the conventional image sensor in FIG. 3B. Moreover, the electrical field distribution in a region of the red filter unit 20a and the sensing unit 12a is declined, and thus the optical cross talk of the image sensor 1 is decreased.

Figure 4:
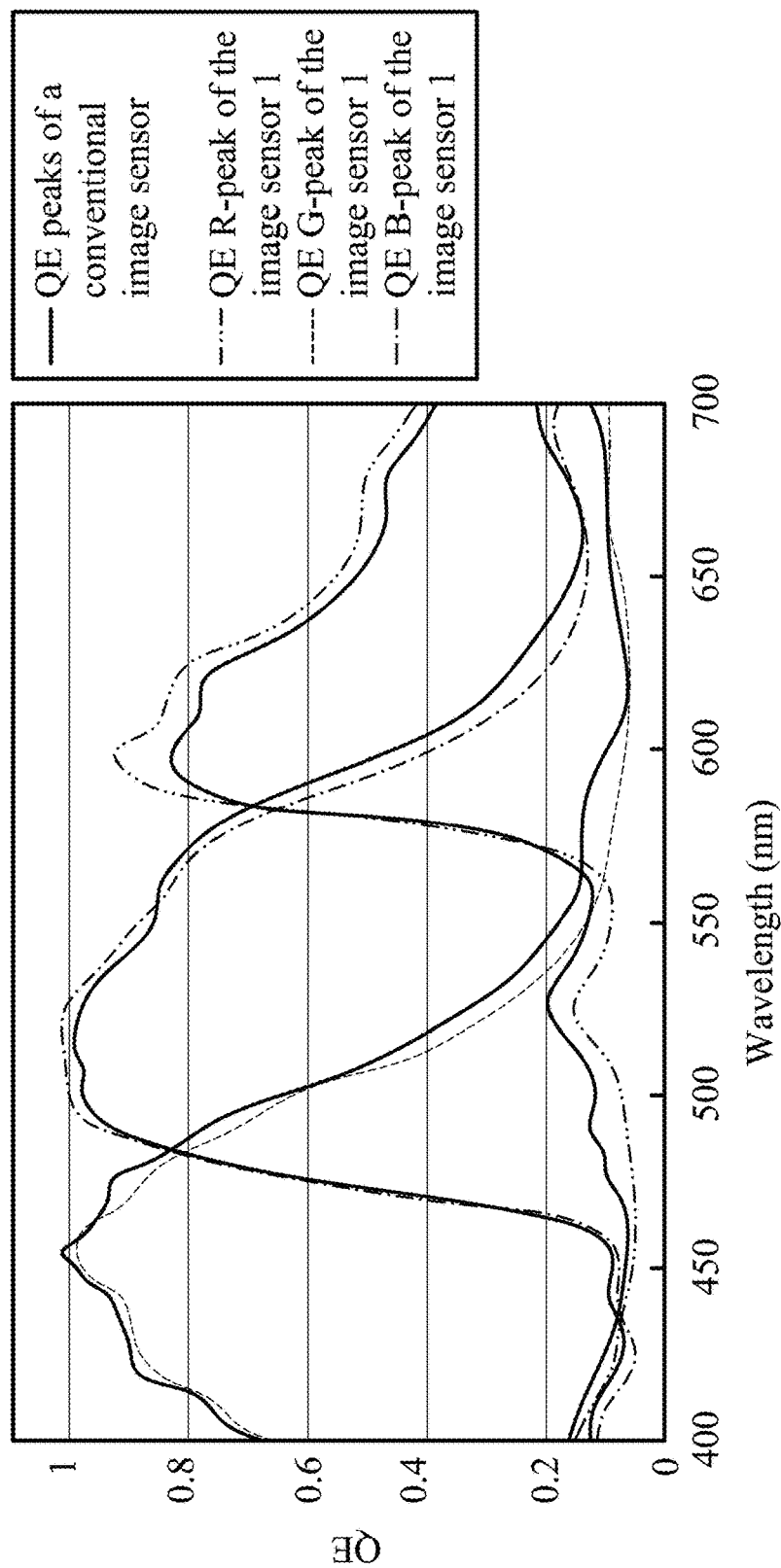
FIG. 4 is a QE spectrum diagram of the image sensor of the present disclosure and a conventional image sensor.

As shown in FIG. 4, the sensitivity and the optical cross talk of the image sensor 1 of the present disclosure are significantly improved according to the QE (Quantum Efficiency) spectrum. The QE R-peak of the image sensor 1 is increased about 8% in comparison with a conventional image sensor, and the QE G-peak of the image sensor 1 is increased about 2% in comparison with the conventional image sensor. In addition, the optical cross talk of the image sensor 1 is decreased about 5% at 535 nm in comparison with the conventional image sensor. The SNR (Signal to Noise Ratio) 10 of the image sensor 1 of the present disclose is improved about 4 Lux in comparison with the conventional image sensor.

Figure 5:
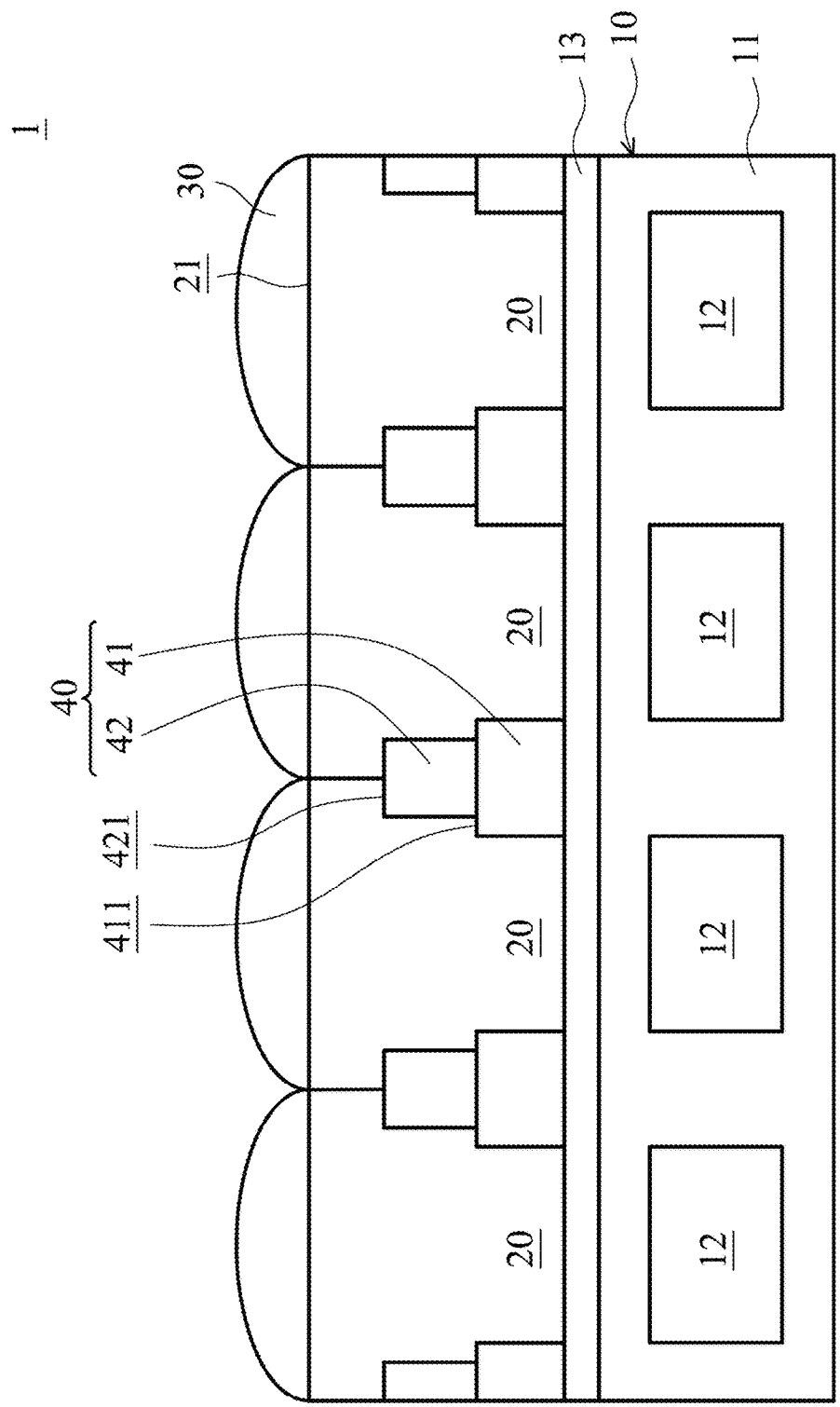
FIG. 5 is a schematic view of an image sensor in accordance with a second embodiment of the present disclosure.

FIG. 5 is a schematic view of an image sensor 1 in accordance with a second embodiment of the present disclosure. In this embodiment, the grid structure 40 includes two layers of partition walls 41 and 42. The top surface 421 of the partition wall 42 (or the grid structure 40) is a distance from the top surfaces 21 of two adjacent filter units 20. In other words, the top surface 421 of the second partition is completely in contact with the adjacent filter units 20.

Figure 6:
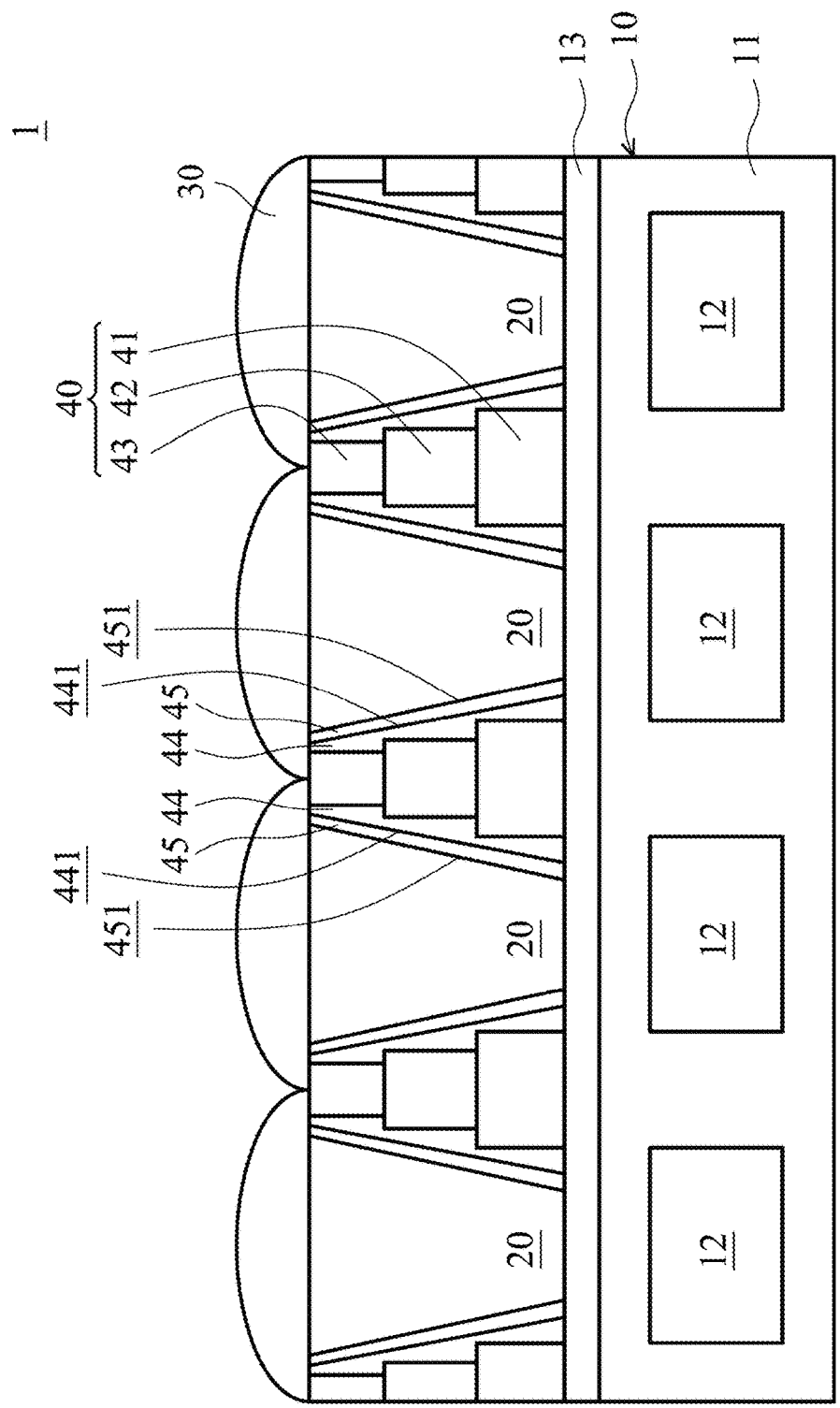
FIG. 6 is a schematic view of an image sensor in accordance with a third embodiment of the present disclosure.

FIG. 6 is a schematic view of an image sensor 1 in accordance with a third embodiment of the present disclosure. In this embodiment, the grid structure 40 further includes one or more cover elements. In some embodiments, the grid structure 40 includes a first cover element 44 and a second cover element 45.

The first cover element 44 is located between the partition walls 41, 42 and 43 and one of the filter units 20 adjacent to the first cover element 44. In this embodiment, the first cover element 44 is located between the partition walls 41, 42 and 43 and the second cover element 45. The first cover element 44 includes a first cover surface 441 inclined relative to the sensing layer 10. In some embodiments, the first cover surface 441 is a plane. The angle between the first cover surface 441 and the sensing layer 10 is in a range from about 70 degrees to about 95 degrees.

The second cover element 45 is located between the first cover element 44 and one of the filter units 20 adjacent to the second cover element 45. In this embodiment, the second cover element 45 is in contact with the filter unit 20 and the first cover element 44. The second cover element 45 includes a second cover surface 451 inclined relative to the sensing layer 10. In some embodiments, the second cover surface is a plane.

The angle between the second cover surface 451 and the sensing layer 10 is in a range from about 60 degrees to about 90 degrees. In some embodiments, the slope of the second cover surface 451 relative to the sensing layer 10 is greater than the slope of the first cover surface 441 relative to the sensing layer 10.

The refractive index of the first cover element 44 is less than the refractive index of the partition wall 41. The refractive index of the second cover element 45 is less than the refractive index of the first cover element 44. For example, the refractive index of the first cover element 44 is in a range from about 1.25 to about 1.32. The refractive index of the second cover element 45 is in a range from about 1.2 to about 1.27.

In some embodiments, the second cover element 45 is omitted. The first cover element 44 is in contact with the filter unit 20.

With the structures of the cover elements 44 and 45, the light-leakage due to the grid structure 40 is minimized, and the waveguide effect in the filter units 20 and the quantity of light passing through the filter units 20 are improved. Accordingly, the image quality of the image sensor 1 is improved.

Figure 7:
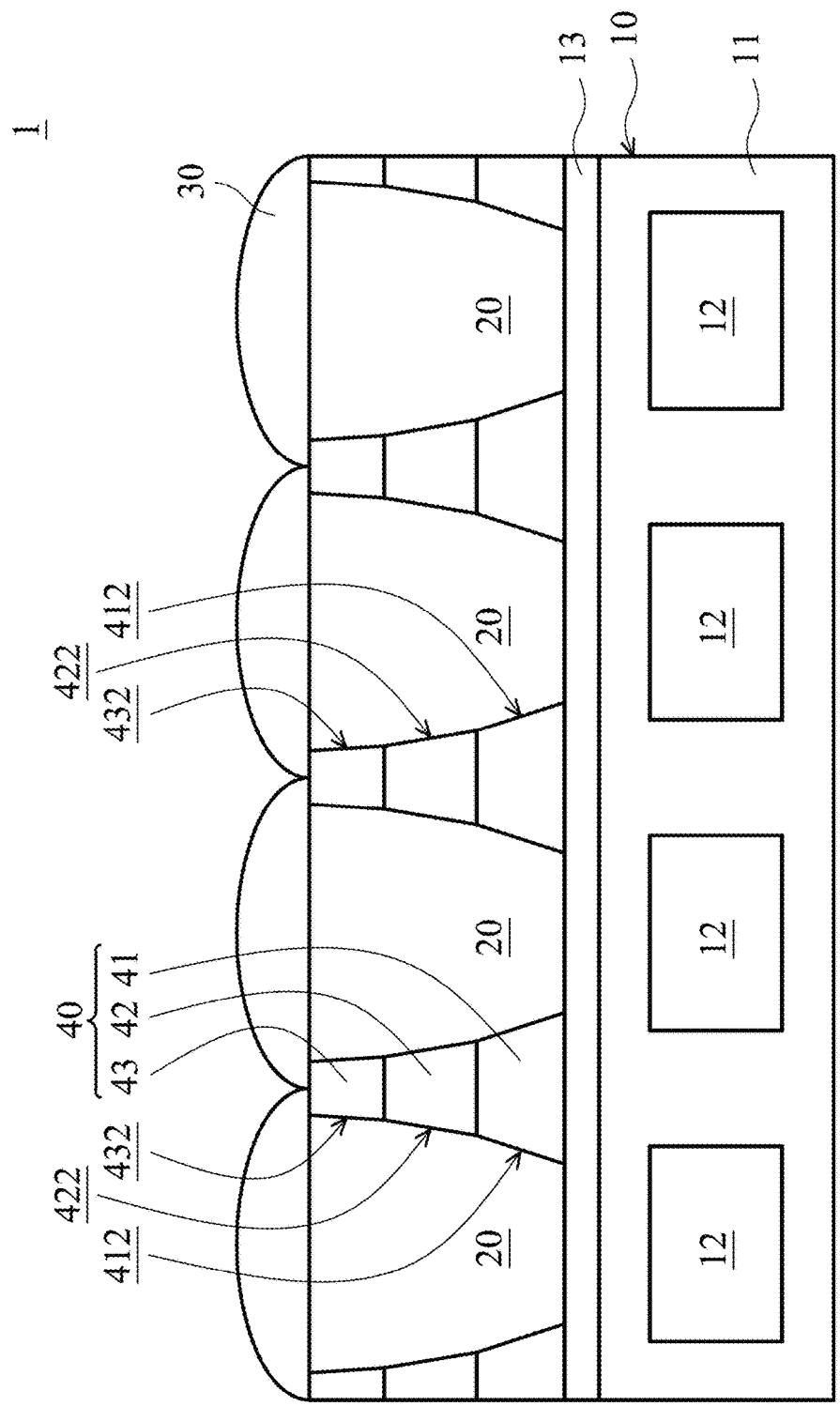
FIG. 7 is a schematic view of an image sensor in accordance with a fourth embodiment of the present disclosure.

FIG. 7 is a schematic view of an image sensor 1 in accordance with a fourth embodiment of the present disclosure. In this embodiment, the cross sections of the partition walls 41, 42 and 43 are trapezoidal. The partition wall 41 has two side surfaces 412 in contact with the filter units 20. The side surfaces 412 are inclined relative to the sensing layer 10. In some embodiments, the side surfaces 412 are planes. The side surfaces 412 are symmetrical about a center of the partition wall 41.

The partition wall 42 has two side surfaces 422 in contact with the filter units 20. The side surfaces 422 are inclined relative to the sensing layer 10. In some embodiments, the side surfaces 422 are planes. The side surfaces 422 are symmetrical about a center of the partition wall 42.

The partition wall 43 has two side surfaces 432 in contact with the filter units 20. The side surfaces 432 are inclined relative to the sensing layer 10. In some embodiments, the side surfaces 432 are planes. The side surfaces 432 are symmetrical about a center of the partition wall 43.

The slope of the side surface 412 relative to the sensing layer 10 is greater than the slope of the side surface 422 relative to the sensing layer 10. The slope of the side surface 422 relative to the sensing layer 10 is greater than the slope of the side surface 432 relative to the sensing layer 10.

For example, the angle between the extension of the side surface 412 and the sensing layer 10 is in a range from about 50 degrees to about 70 degrees. The angle between the extension of the side surface 422 and the sensing layer 10 is in a range from about 60 degrees to about 80 degrees. The angle between the extension of the side surface 432 and the sensing layer 10 is in a range from about 70 degrees to about 90 degrees.

With the structures and the slops of the partition walls 41, 42 and 43, the light-leakage due to the grid structure 40 is minimized, and the waveguide effect in the filter units 20 and the quantity of light passing through the filter units 20 are improved. The image quality of the image sensor 1 is improved.

Figure 8:
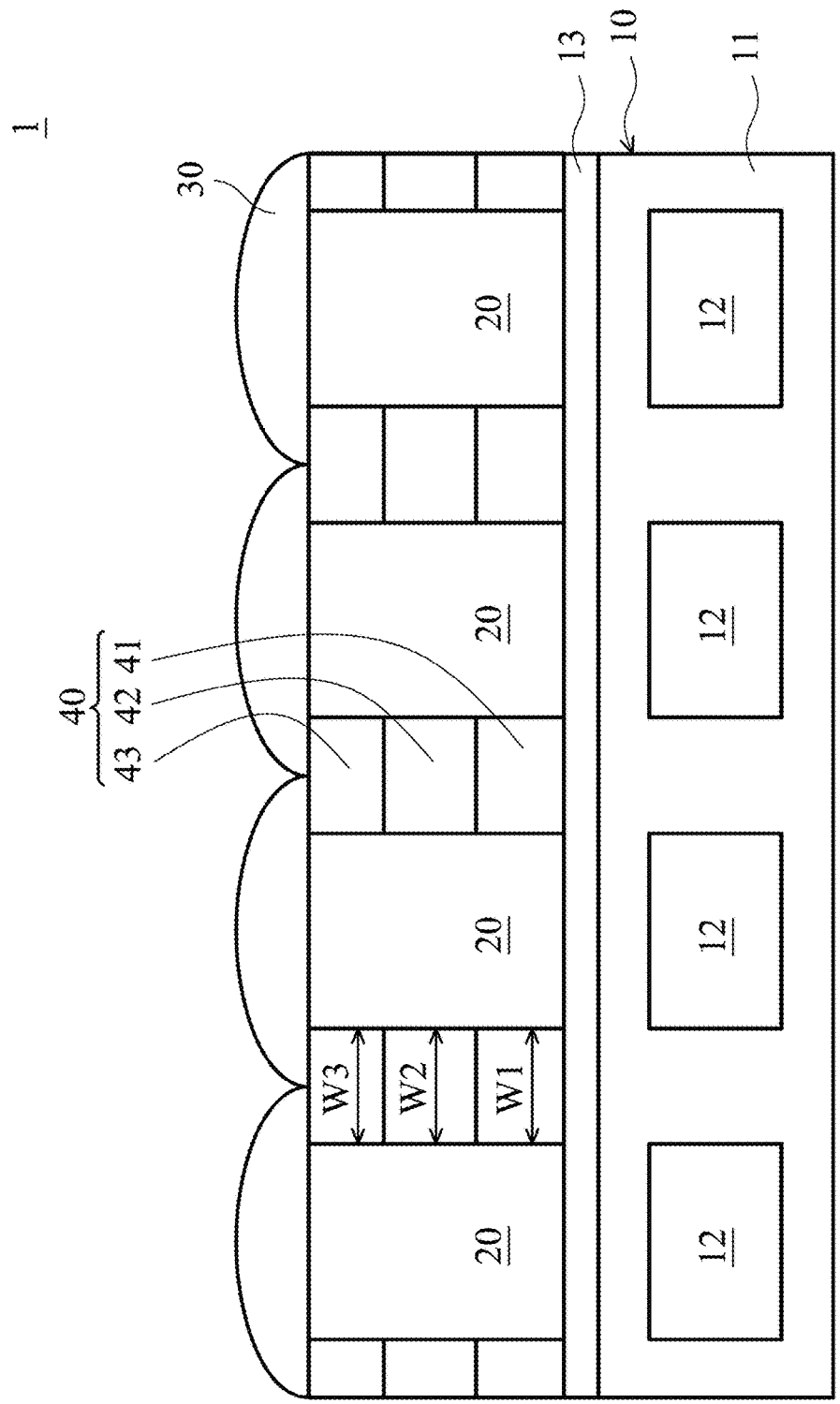
FIG. 8 is a schematic view of an image sensor in accordance with a fifth embodiment of the present disclosure.

FIG. 8 is a schematic view of an image sensor 1 in accordance with a fifth embodiment of the present disclosure. In this embodiment, the width W1 of the partition wall 41 is equal to the width W2 of the partition wall 42. The width W2 of the partition wall 42 is equal to the width W3 of the partition wall 43. Moreover, the refractive index of the partition wall 41 is less than the refractive index of the partition wall 42. The refractive index of the partition wall 42 is less than the refractive index of the partition wall 43.

With the widths and the refractive index of the partition walls 41, 42 and 43, the light-leakage due to the grid structure 40 is minimized, and the waveguide effect in the filter units 20 and the quantity of light passing through the filter units 20 are improved. Accordingly, the image quality of the image sensor 1 is improved.

Figure 9:
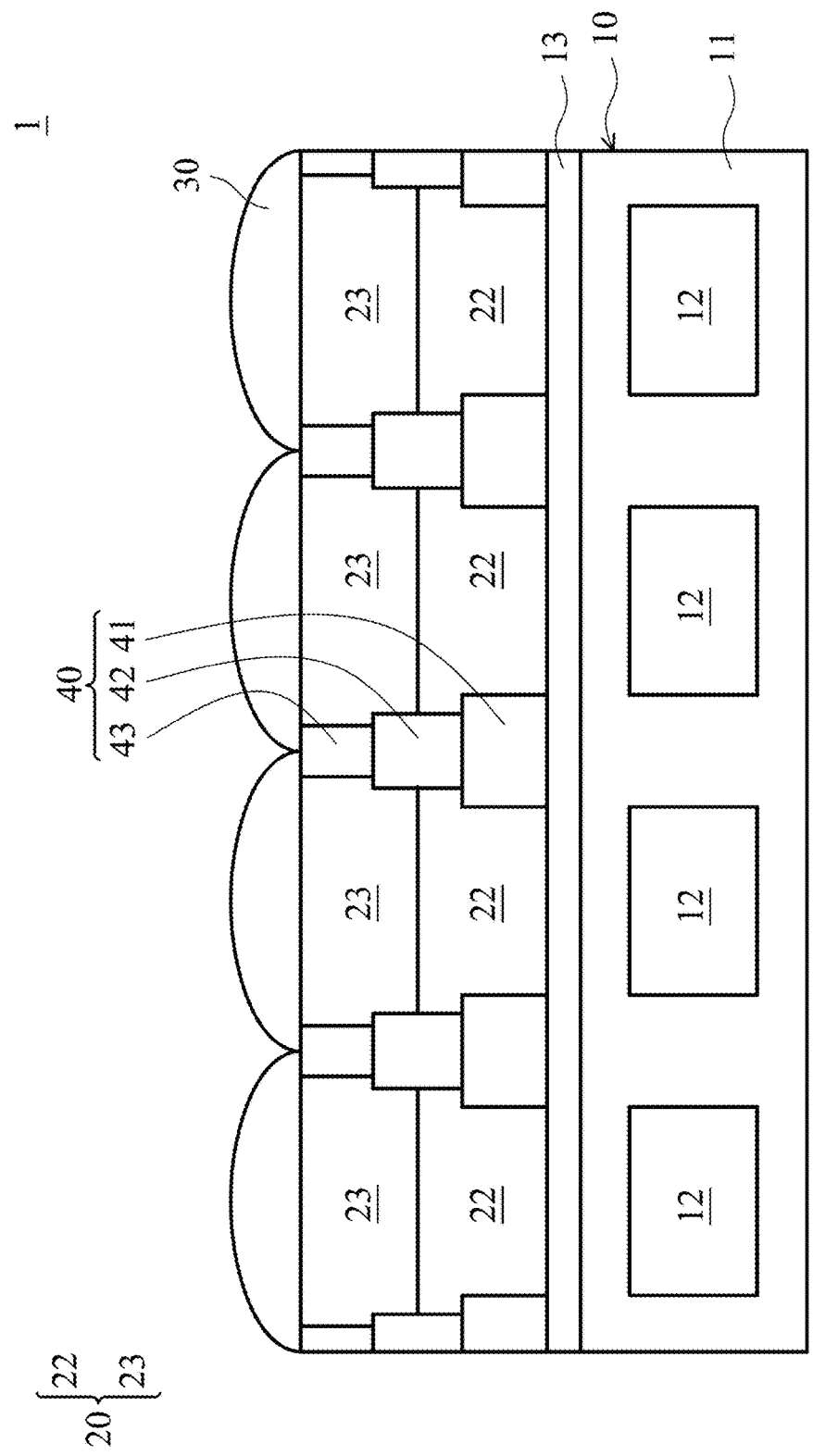
FIG. 9 is a schematic view of an image sensor in accordance with a sixth embodiment of the present disclosure.

FIG. 9 is a schematic view of an image sensor 1 in accordance with a sixth embodiment of the present disclosure. Each of the filter units 20 includes a number of portions stacked on each other. In this embodiment, each of the filter units 20 includes a lower portion 22 and an upper portion 23. The lower portion 22 is disposed on the sensing layer 10, and the upper portion 23 is disposed on the lower portion 22.

The refractive indexes of the partition walls 41, 42 and 43 are less than the refractive index of the upper portion 23. The refractive index of the upper portion 23 is less than the refractive index of the lower portion 22. In other words, the refractive indexes of the filter unit 20 are gradually decreased from the sensing layer 10 to the microlenses 30. In some embodiments, the refractive index of the upper portion 23 is in a range from about 1.7 to about 2.5. The refractive index of the lower portion 22 is in a range from about 2.5 to about 3.2.

In some embodiments, the filter units 20 and the grid structure 40 comply with the following formula: $\Sigma Ncfn \times Dcfn = \Sigma Neffm \times Dm$. The Ncfn is an effect refractive index of one of the portions of the filter units 20, the Dcfn is a thickness of one of the portions 22 and 23, the Neffm is an effect refractive index of one of the partition walls 41, 42 and 43, and the Dm is a thickness of one of the partition walls 41, 42 and 43. When the filter units 20 and the grid structure 40 comply with the described formula, the waveguide effect in the filter units 20 and the quantity of light passing through the filter units 20 are improved.

With the structures and the refractive indexes of the filter units 20 and the grid structure 40, the light-leakage due to the grid structure 40 is minimized, and the waveguide effect in the filter units 20 and the quantity of light passing through the filter units 20 are improved. Accordingly, the image quality of the image sensor 1 is improved.

In conclusion, with the grid structure of the image sensor, the optical cross talk of the image sensor is minimized. Moreover, a portion of the light entering the grid structure is guided to the filter units, and thus the signal strength of the sensing units is improved. Therefore, the image quality of the image sensor is improved.

The disclosed features may be combined, modified, or replaced in any suitable manner in one or more disclosed embodiments, but are not limited to any particular embodiments.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensor, comprising:
   a sensing layer;
   a plurality of filter units disposed on the sensing layer; and
   a grid structure, disposed on the sensing layer, surrounding each of the filter units, wherein the grid structure comprises:
      a first partition wall, disposed on the sensing layer, located between two adjacent filter units;
      a second partition wall, disposed directly on the first partition wall, located between the two adjacent filter units; and
      a first cover element located between the first partition wall and one of the two adjacent filter units, and located between the second partition wall and the one of the two adjacent filter units,
   wherein a first refractive index of the first partition wall is less than a second refractive index of the second partition wall, and a refractive index of the first cover element is less than the first refractive index,
   wherein a bottom surface of the second partition wall that contacts a top surface of the first partition wall is smaller than the top surface of the first partition wall, and
   wherein side surfaces of the first partition wall and the second partition wall, on a same lateral side of the first partition wall and the second partition wall, are stepped and lie in separate planes.

2. The image sensor as claimed in claim 1, wherein a first width of the first partition wall is greater than a second width of the second partition wall, and the first width and the second width are measured in a transversal direction parallel to the sensing layer.

3. The image sensor as claimed in claim 1, wherein a first cross section of the first partition wall and a second cross section of the second partition wall are rectangular or trapezoidal.

4. The image sensor as claimed in claim 1, wherein the first partition wall has a first side surface in contact with one of the two adjacent filter units and inclined relative to the sensing layer, and the second partition wall has a second side surface in contact with one of the two adjacent filter units and inclined relative to the sensing layer, wherein a first slope of the first side surface relative to the sensing layer is greater than a second slope of the second side surface relative to the sensing layer.

5. The image sensor as claimed in claim 1, wherein the first partition wall has a first top surface, opposite from the sensing layer, covered by the second partition wall and the two adjacent filter units, and the second partition wall has a second top surface, opposite from the first partition wall, covered by the two adjacent filter units.

6. The image sensor as claimed in claim 1, wherein the grid structure further comprises a second cover element located between the first cover element and the one of the two adjacent filter units, wherein a refractive index of the second cover element is less than the refractive index of the first cover element.

7. The image sensor as claimed in claim 1, wherein each of the filter units comprises a lower portion disposed on the sensor layer, and an upper portion disposed on the lower portion, wherein the second refractive index is less than a refractive index of the upper portion, and the refractive index of the upper portion is less than a refractive index of the lower portion.

8. The image sensor as claimed in claim 1, further comprising a plurality of microlenses respectively disposed on one of the filter units, wherein the sensing layer includes a plurality of sensing units arranged in a sensing array, and each of the filter units disposed on one of the sensing units.

9. The image sensor as claimed in claim 1, wherein the grid structure further comprises a third partition wall, disposed on the second partition wall, located between the two adjacent filter units, wherein the second refractive index of the second partition wall is less than a third refractive index of the third partition wall.

10. The image sensor as claimed in claim 9, wherein a first width of the first partition wall is greater than a second width of the second partition wall, a second width of the second partition wall is greater than a third width of the third partition wall, and the first width, the second width, and the third width are measured in a transversal direction parallel to the sensing layer.

11. The image sensor as claimed in claim 1, wherein the separate planes are parallel, and no horizontal plane bisecting the filter units and parallel to the sensing layer intersects with more than one of the side surfaces on the same lateral side of the first partition wall and the second partition wall.

12. The image sensor as claimed in claim 1, wherein the separate planes meet at an angle with respect to each other, and no horizontal plane bisecting the filter units and parallel to the sensing layer intersects with more than one of the side surfaces on the same lateral side of the first partition wall and the second partition wall.

13. An image sensor, comprising:
a sensing layer;
a plurality of filter units disposed on the sensing layer; and
a grid structure, disposed on the sensing layer, surrounding each of the filter units, wherein the grid structure comprises:
 a first partition wall, disposed on the sensing layer, located between two adjacent filter units;
 a second partition wall, disposed directly on the first partition wall, located between the two adjacent filter units; and
 a first cover element located between the first partition wall and one of the two adjacent filter units, and located between the second partition wall and the one of the two adjacent filter units,
wherein a first cross section of the first partition wall and a second cross section of the second partition wall are rectangular or trapezoidal,
wherein a first width of a top surface the first partition wall that contacts the second partition wall is greater than a second width of a bottom surface of the second partition wall, and the first width and the second width are measured in a transversal direction parallel to the sensing layer,
wherein a first refractive index of the first partition wall is less than a second refractive index of the second partition wall, and a refractive index of the first cover element is less than the first refractive index, and
wherein side surfaces of the first partition wall and the second partition wall, on a same lateral side of the first partition wall and the second partition wall, are stepped and lie in separate planes.

14. The image sensor as claimed in claim 13, wherein refractive indexes of the first and the second partition wall are the same.

15. The image sensor as claimed in claim 13, wherein the first partition wall has a first side surface in contact with one of the two adjacent filter units and inclined relative to the sensing layer, and the second partition wall has a second side surface in contact with one of the two adjacent filter units and inclined relative to the sensing layer, wherein a first slope of the first side surface relative to the sensing layer is greater than a second slope of the second side surface relative to the sensing layer.

16. The image sensor as claimed in claim 13, wherein the first partition wall has a first top surface, opposite from the sensing layer, covered by the second partition wall and the two adjacent filter units, and the second partition wall has a second top surface, opposite from the first partition wall, covered by the two adjacent filter units.

17. The image sensor as claimed in claim 13, wherein the grid structure further comprises a second cover element located between the first cover element and the one of the filter units adjacent to the second cover element, wherein a refractive index of the second cover element is less than the refractive index of the first cover element.

18. The image sensor as claimed in claim 13, wherein each of the filter units comprises a lower portion disposed on the sensor layer, and an upper portion disposed on the lower portion, wherein the second refractive index is less than a refractive index of the upper portion, and the refractive index of the upper portion is less than a refractive index of the lower portion.

19. The image sensor as claimed in claim 13, further comprising a plurality of microlenses respectively disposed on one of the filter units, and wherein the sensing layer includes a plurality of sensing units arranged in a sensing array, and each of the filter units disposed on one of the sensing units.

20. The image sensor as claimed in claim 13, wherein the grid structure further comprises a third partition wall, disposed on the second partition wall, located between the two adjacent filter units, wherein the second width of the second partition wall is greater than a third width of the third partition wall, and the third width is measured in the transversal direction.

* * * * *